United States Patent
Chen et al.

(10) Patent No.: US 8,601,043 B2
(45) Date of Patent: Dec. 3, 2013

(54) EQUALIZER USING INFINITIVE IMPULSE RESPONSE FILTERING AND ASSOCIATED METHOD

(75) Inventors: Hung-Kun Chen, Taipei (TW); Bo-Ju Chen, Hsinchu (TW); Zhi-Ren Chang, Hsinchu (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 1681 days.

(21) Appl. No.: 11/872,944

(22) Filed: Oct. 16, 2007

(65) Prior Publication Data

US 2008/0133631 A1 Jun. 5, 2008

(30) Foreign Application Priority Data

Oct. 16, 2006 (TW) .............................. 95138130 A

(51) Int. Cl.
*G06F 17/10* (2006.01)
(52) U.S. Cl.
USPC .......................................... 708/323; 708/300
(58) Field of Classification Search
None
See application file for complete search history.

(56) References Cited

U.S. PATENT DOCUMENTS

| | | | | |
|---|---|---|---|---|
| 5,148,382 A | * | 9/1992 | Kishi | ............................ 708/306 |
| 5,506,910 A | * | 4/1996 | Miller et al. | .................. 381/103 |
| 6,097,824 A | * | 8/2000 | Lindemann et al. | .......... 381/315 |
| 6,778,601 B2 | | 8/2004 | Ise et al. | |
| 7,061,848 B2 | | 6/2006 | Shim | |

FOREIGN PATENT DOCUMENTS

JP 11261356 A 9/1999

OTHER PUBLICATIONS

Mitra, Sanjit K. Digital Signal Processing—a computer-based approach, Dec. 31, 1998.

* cited by examiner

*Primary Examiner* — Michael D Yaary
(74) *Attorney, Agent, or Firm* — Kirton McConkie; Evan R. Witt

(57) ABSTRACT

An equalizer for equalizing an input signal includes an infinitive impulse response (IIR) filtering portion for filtering the input signal to produce N filtered outputs; a gain-adjusting portion coupled to the IIR filtering portion with N gains for adjusting the N filtered outputs to produce N gained outputs, respectively; and an adder for summing the N gained outputs to generate an equalized output signal. N is an integer larger than 2.

17 Claims, 11 Drawing Sheets

EQUALIZER USING INFINITIVE IMPULSE RESPONSE FILTERING AND ASSOCIATED METHOD

FIELD OF THE INVENTION

The present invention relates to an equalizer and associated method, and more particularly to an equalizer using infinitive impulse response filtering and associated method.

BACKGROUND OF THE INVENTION

With the great advance of audiovisual systems such as stereo system or television system, equalizers become one of the key components to the audiovisual systems with different quality.

An application example of an equalizer is shown in FIG. 1A, which is an image captured from an application program Winamp of a Microsoft Windows OS (operating system). WINAMP can control audio in the Microsoft Windows OS, wherein a plurality of virtual control buttons are provided for equalization 100, e.g. volume control 102 and sound balance 104. In this example, the equalizer 102 includes ten bands, e.g. 60 Hz, 170 Hz, 310 Hz, 1 KHz, 3 KHz, 6 KHz, 12 KHz, 14 KHz and 16 KHz, independently adjustable through respective virtual dragging buttons 101. The buttons 101 of equalizer 100 shown in FIG. 1A are all tuned at a level of zero decibel (dB), which means the original audio signal is present. FIG. 1B illustrates a frequency response corresponding to the equalizer 100 set at a "0 dB" level, which is ideally flat. In another example, the buttons 101 of equalizer 100 are all set at a level of +12 decibel (dB), as shown in FIG. 2A, in which the desired ideal result is intended to be an absolutely flat frequency response as shown in FIG. 2B. Conventionally, extremely high hardware cost is inevitable in order to achieve the ideally flat frequency response. For example, a complex time-domain circuitry involving inverse Fourier transformation is needed as well as a high-performance microprocessor, e.g. a 32-bit ARM (Advanced RISC Machine) or MIPS (Microprocessor without Interlocked Pipeline Stages) microprocessor. In addition to high cost, it is also a waste of the hardware resource.

Alternatively, the prior art may adopt a low-cost equalizer including several band-pass filters to roughly process several bands by way of a design tool MATLAB. FIG. 3 exemplifies a frequency response of an equalizer including two band-pass filters to process two bands by way of MATLAB. As shown, the two band-pass filters BPA and BPB are roughly centered on frequencies f1 and f2. Accordingly, when all the dragging buttons are tuned to +12 dB, the frequency response only appears flat around the regions near the frequencies f1 and f2. Moreover, serious distortion of audio signals occurs at crossing bands, and thus the quality of the audio signals deteriorates seriously.

SUMMARY OF THE INVENTION

The present invention provides a low-cost and high-quality equalizer utilizing infinitive impulse response filtering and associated method.

The present invention discloses an equalizer for equalizing an input signal, which includes an infinitive impulse response (IIR) filtering portion for filtering the input signal to produce N filtered outputs; a gain-adjusting portion coupled to the IIR filtering portion for adjusting the N filtered outputs with N gains to produce N gained outputs, respectively; and an adder for summing the N gained outputs to generate an equalized output signal; wherein N is an integer larger than 2.

Preferably, the IIR filtering portion comprises a plurality of filtering units and the filtering units are arranged in a tree structure.

The present invention also disclose a method for equalizing an input signal, which includes receiving the input signal; producing N filtered outputs by infinitive-impulse-response (IIR) filtering the input signal in N bands; and operating the N filtered outputs into an equalized output signal; wherein N is an integer larger than 2.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

MATLAB is a popular tool for IC design, but only provide basic functions such as low-pass, band-pass, high-pass and all-pass filtering. Therefore, it is infeasible in prior art to design an equalizer with a high quality or a high-Q filter by simply using the MATLAB tool. An aim to the present invention is to utilize the MATLAB tool to develop a low-cost and high-quality equalizer. In other words, the present invention realizes an ideal frequency response while exempting from the use of costly circuitry essential to the design of a high-quality equalizer in the prior art, e.g. high-performance microprocessor or inverse Fourier transformation circuitry.

Figure 1A:
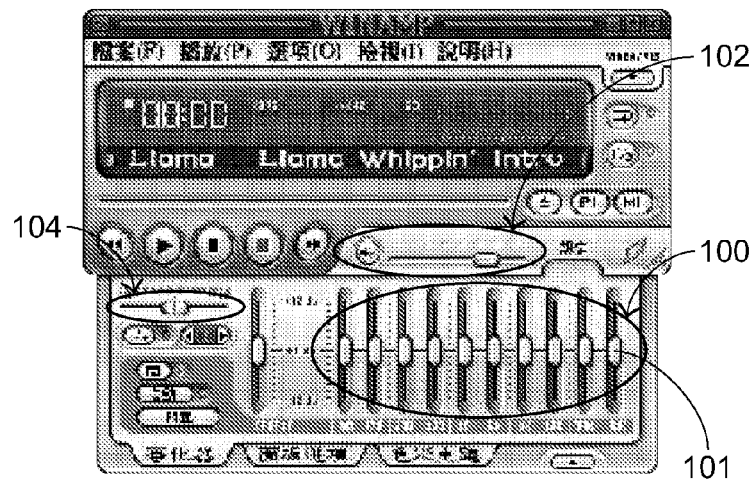
FIG. 1A shows an image captured from an application program Winamp, all tuned at zero decibel (dB)
Figure 1B:
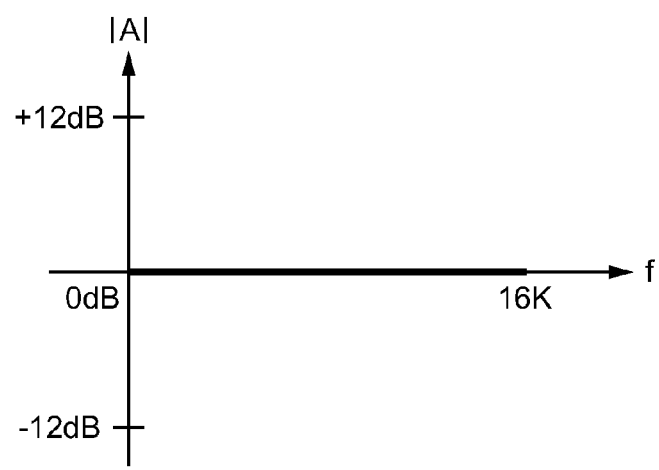
FIG. 1B is a plot schematically showing an ideally flat frequency response under the condition of FIG. 1A.
Figure 2A:
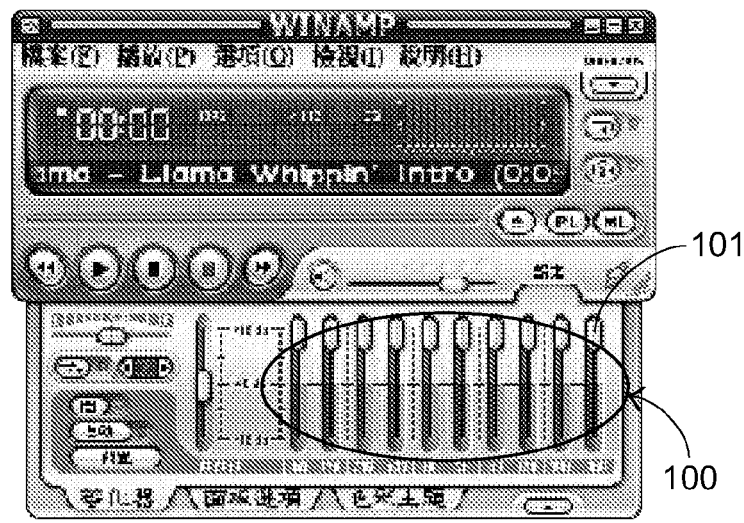
FIG. 2A shows an image captured from the application program Winamp, all tuned at a level of +12 decibel (dB)
Figure 2B:
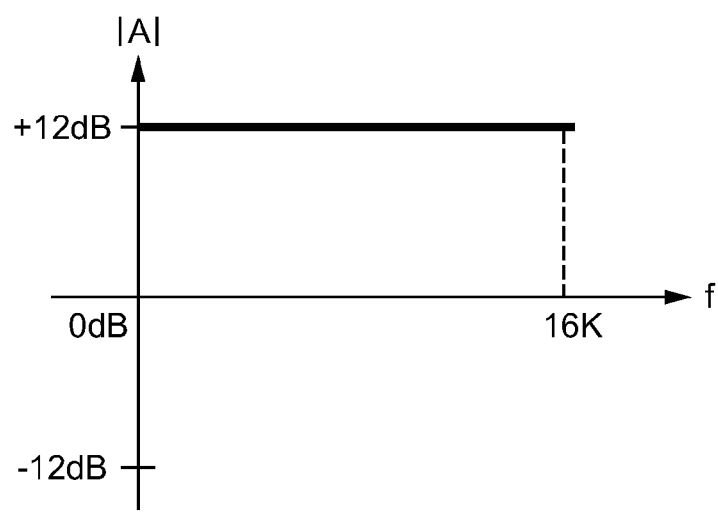
FIG. 2B is a plot schematically showing an ideally flat frequency response under the condition of FIG. 2A.
Figure 3:
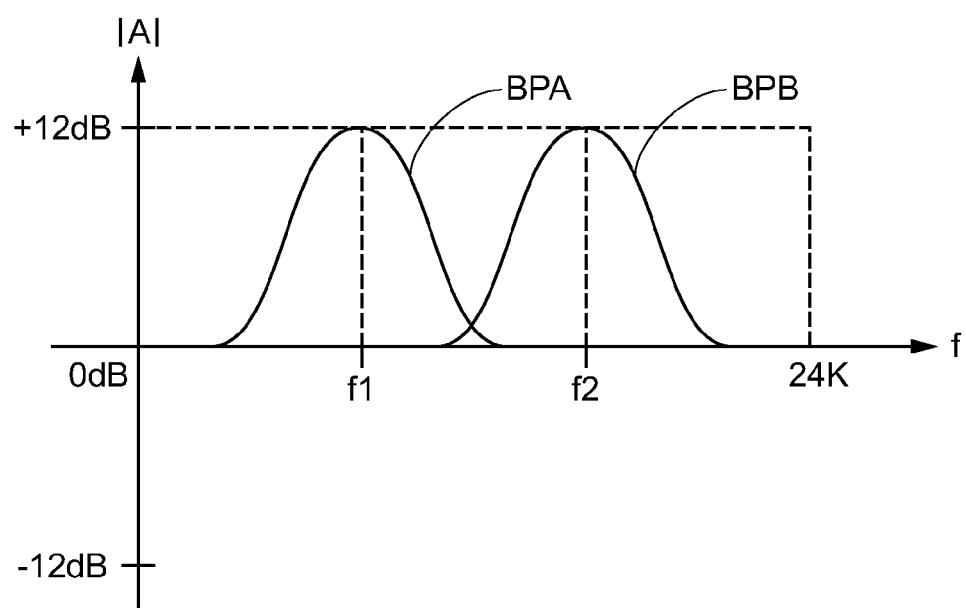
FIG. 3 is a plot exemplifying a typical frequency response of an equalizer including two band-pass filters to process bands by way of MATLAB.
Figure 4A:
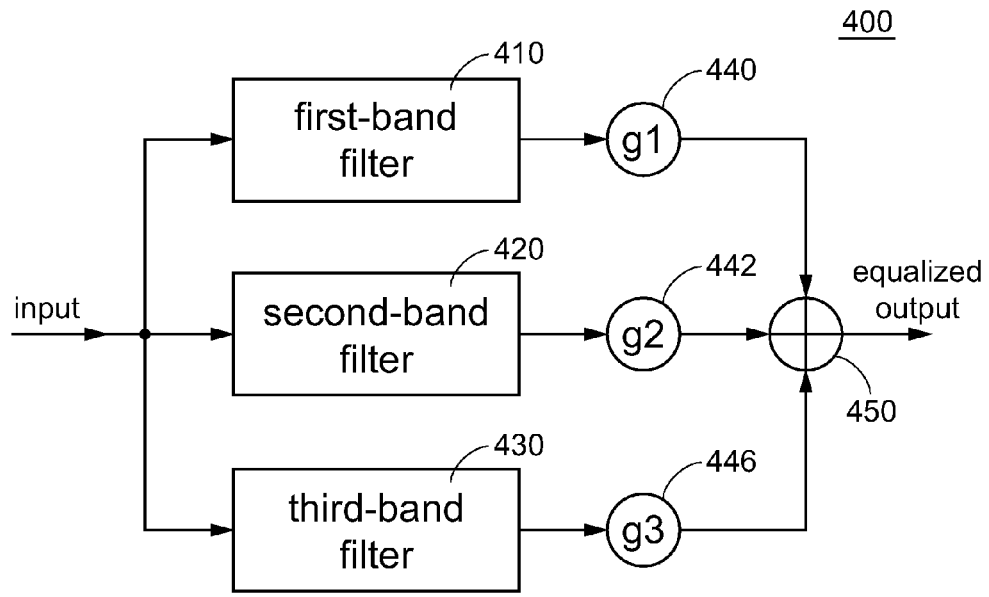
FIG. 4A is a circuit block diagram illustrating a three-band equalizer according to an embodiment of the present invention.
Figure 4B:
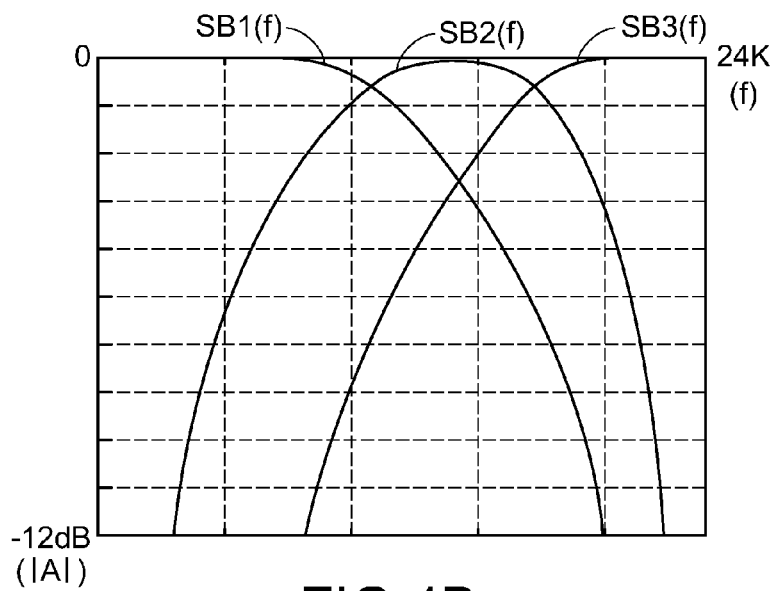
FIG. 4B is a plot schematically showing a frequency response of the equalizer of FIG. 4A.

Please refer to FIG. 4A which is a frequency-domain circuit block diagram of a multi-band equalizer according to an embodiment of the present invention. In this embodiment, the equalizer 400 includes a filtering portion including a first-band filter 410, a second-band filter 420 and a third-band filter 430, whose frequency response transfer functions are $SB1(f)$, $SB2(f)$ and $SB3(f)$, as shown in FIG. 4B, and a gain-adjusting portion including gain-adjusting units 440, 442 and 446 for respectively adjusting the frequency response transfer functions are $SB1(f)$, $SB2(f)$ and $SB3(f)$ with gains g1, g2 and g3. With an adder 450, the overall equalized output of the equalizer 400 is expressed as below:

Equalized output=$SB1(f)*g1+SB2(f)*g2+SB3(f)*g3$

For realizing an ideal equalized output, proper frequency response transfer functions $SB1(f)$, $SB2(f)$ and $SB3(f)$ should be found. In this embodiment, the filters 410, 420 and 430 are implemented with an infinitive impulse response (IIR) low-pass filter, an IIR band-pass filter and an IIR high-pass filter, respectively. In order to obtain an ideally flat frequency response, the frequency response transfer functions $SB1(f)$, $SB2(f)$ and $SB3(f)$ of the IIR low-pass filter, IIR band-pass filter and IIR high-pass filter fulfill the following equation:

$$SB1(f)+SB2(f)+SB3(f)=APP(f) \quad (1),$$

where APP(f) is a transfer function of an all-pass filter.

More specifically, the following formula is adopted to fulfill the ideal frequency response:

$$SB1(f)+SB2(f)+SB3(f)=APP(f)=AP1(f)*AP2(f) \quad (2),$$

where $AP1(f)$ and $AP2(f)$ are transfer functions of two all-pass filters.

The two all-pass filters with transfer functions $AP1(f)$ and $AP2(f)$ can be obtained by way of a MATLAB tool. A low-pass filter $LP1(f)$ and a high-pass filter $HP2(f)$ are first designed by way of the MATLAB tool. Then, a high-pass filter $HP1(f)$ complementary to the low pass-filter $LP1(f)$ and a low-pass filter $LP2(f)$ complementary to the high pass-filter $HP2(f)$ can be correspondingly generated by the MATLAB tool. The two pairs of complementary filters are then synthesized to obtain the two all-pass filters, wherein the following equations are satisfied:

$$LP1(f)+HP1(f)=AP1(f) \quad (3);$$

and $$LP2(f)+HP2(f)=AP2(f) \quad (4).$$

The equalizer according to the present invention then uses such correlated low-pass filters, high-pass filters and all-pass filters to perform desired filtering operations.

For example, set the frequency response transfer function $SB3(f)$ of the high-pass filter to be:

$$SB3(f)=HP2(f)*HP1(f) \quad (5)$$

wherein two high-pass filters are cascaded to be a high-pass filter $SB3(f)$. Meanwhile, set the frequency response transfer function $SB2(f)$ of the band-pass filter to be:

$$SB2(f)=LP2(f)*HP1(f) \quad (6)$$

wherein a low-pass filter and a high-pass filter are cascaded to be a band-pass filter $SB2(f)$ sharing a common factor $HP1(f)$ with $SB3(f)$. Likewise, set the frequency response transfer function $SB1(f)$ of the band-pass filter to be:

$$SB1(f)=LP1(f)*AP2(f) \quad (7)$$

wherein a low-pass filter and an all-pass filter are cascaded to be a low-pass filter $SB1(f)$. Thus, $SB1(f)$, $SB2(f)$ and $SB3(f)$ fulfill the equation (2) as derived in the following:

$$\begin{aligned} SB1(f)+SB2(f)+SB3(f) &= LP1(f)*AP2(f)+LP2(f)* \\ &\quad HP1(f)+HP2(f)*HP1(f) \\ &= LP1(f)*AP2(f)+HP1(f)* \\ &\quad (LP2(f)+HP2(f)) \\ &= LP1(f)*AP2(f)+HP1(f)*AP2(F) \\ &= (LP1(f)+HP1(f))*AP2(F) \\ &= AP1(f)*AP2(f) \\ &= APP(f). \end{aligned}$$

Figure 4C:
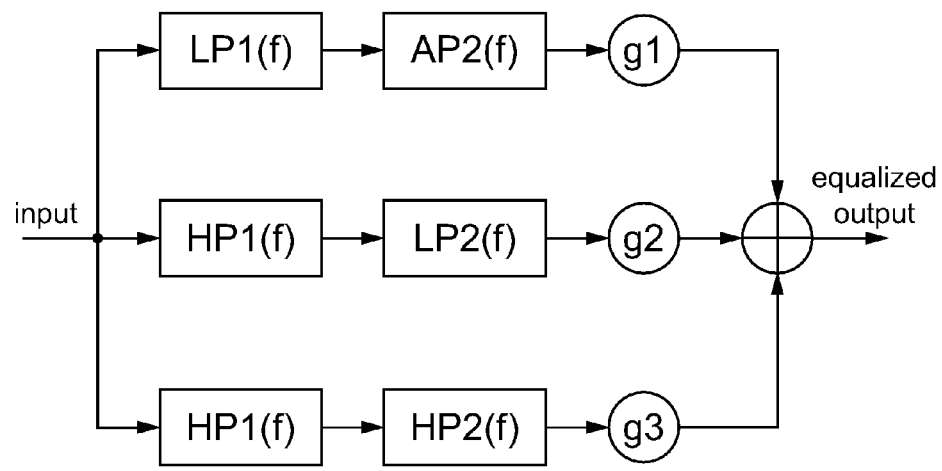
FIG. 4C is a circuit block diagram illustrating an embodiment of the filters for the equalizer of FIG. 4A.

The resulting equalizer is shown in FIG. 4C. The three-band equalizer includes an IIR filtering portion comprising three IIR filters for filtering an input signal simultaneously to produce three filtered outputs, and each of the three IIR filters comprising two (three minus one) filtering units selected from $LP1(f)$, $HP1(f)$, $AP1(f)$, $LP2(f)$, $HP2(f)$ and $AP2(f)$. For example, the three IIR filters are an IIR low-pass filter implemented with $LP1(f)*AP2(f)$, an IIR band-pass filter implemented with $LP2(f)*HP1(f)$, and an IIR high-pass filter implemented with $HP2(f)*HP1(f)$. The three filtered outputs are then gain-adjusted with g1, g2 and g3, respectively, to produce three gain-adjusted outputs, which are then summed to generate an equalized output signal. That is, Equalized output=$LP1(f)*AP2(f)*g1+LP2(f)*HP1(f)*g2+HP2(f)*HP1(f)*g3$.

Figure 4D:
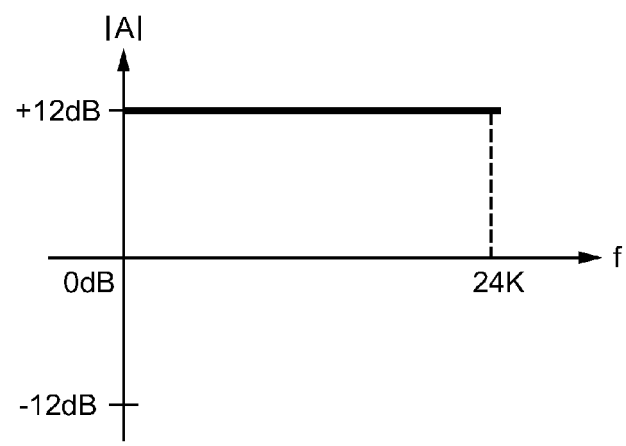
FIG. 4D is a plot schematically showing an ideally flat frequency response of the equalizer in FIG. 4A.

FIG. 4D shows an ideally flat frequency response obtainable by the equalizer of FIG. 4A wherein the gains g1, g2 and g3 are all set to a level of +12 dB.

It should be noted that the settings of $SB1(f)$, $SB2(f)$ and $SB3(f)$ as above are only for exemplification, and other suitable combinations of $SB1(f)$, $SB2(f)$ and $SB3(f)$ can be applied hereto as long as Equation (2) is satisfied. For example, $SB1(f)$, $SB2(f)$ and $SB3(f)$ can also be set as:

$$SB1(f)=LP1(f)*LP2(f)$$

$$SB2(f)=LP2(f)*HP1(f)$$

$$SB3(f)=HP2(f)*AP1(f)$$

so that $$\begin{aligned} SB1(f)+SB2(f)+SB3(f) &= LP1(f)*LP2(f)+LP2(f)* \\ &\quad HP1(f)+HP2(f)*AP1(f) \\ &= LP2(f)*(LP1(f)+HP1(f))+ \\ &\quad HP2(f)*AP1(f) \\ &= LP2(f)*AP1(f)+HP2(f)*AP1(f) \\ &= (LP2(f)+HP2(f))*AP1(f) \\ &= AP2(f)*AP1(f) \\ &= APP(f). \end{aligned}$$

In the above embodiments, $AP1(f)$ and $AP2(f)$ may be first-order all-pass filters, $LP1(f)$ and $LP2(f)$ may be second-order low-pass filters, and HP1($f$) and HP2($f$) may be second-order high-pass filters. As is understood by those skilled in the art, the difference in orders of filters indicates different counts of parameters affecting circuitry or operational complexity. For example, a first-order filter may be presented with three parameters while a second-order filter may be presented with five parameters.

Figure 5A:
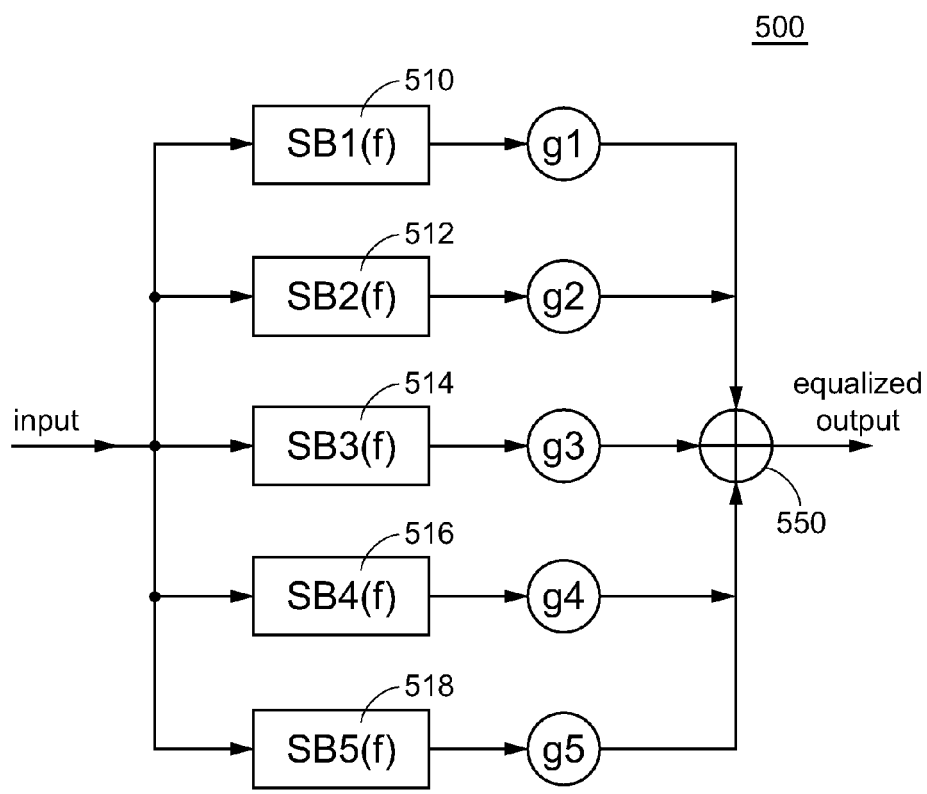
FIG. 5A is a block diagram illustrating a five-band equalizer according to another embodiment of the present invention.

Please refer to FIG. 5A. A frequency-domain circuit block diagram of a five-band equalizer according to another embodiment of the present invention is illustrated. In this embodiment, five frequency response transfer functions SB1($f$), SB2($f$), SB3($f$), SB4($f$) and SB5($f$) with respective gains g1, g2, g3, g4 and g5 are illustrated. The gains g1~g5 respectively adjust the five bands of the equalizer 500 to generate corresponding gain-adjusted signals, which are summed by an adder 550 to generate an ideal equalized output as below:

Equalized output=SB1($f$)*g1+SB2($f$)*g2+SB3($f$)*g3+ SB4($f$)*g4+SB5($f$)*g5

For obtaining the ideal equalized output, suitable frequency response transfer functions SB1($f$), SB2($f$), SB3($f$), SB4($f$) and SB5($f$) should be found. In an embodiment of the present invention, the first-band filter 510, second-band filter 512, third-band filter 514, fourth-band filter 516 and fifth-band filter 518 are implemented with one infinitive impulse response (IIR) low-pass filter, three IIR band-pass filters and one IIR high-pass filter, respectively. In order to obtain an ideally flat frequency response, the frequency response transfer functions SB1($f$)~SB5($f$) of the IIR filters fulfill the following equation:

$$SB1(f)+SB2(f)+SB3(f)+SB4(f)+SB5(f)=APP(f) \quad (8),$$

where APP(f) is a transfer function of an all-pass filter.

More specifically, the following formula is adopted to fulfill the ideal frequency response:

$$SB1(f) + SB2(f) + SB3(f) + SB4(f) + SB5(f) = \quad (9)$$
$$APP(f) = AP1(f) * AP2(f) * AP3(f) * AP4(f),$$

where AP1($f$), AP2($f$), AP3($f$) and AP4($f$) are transfer functions of four all-pass filters.

The four all-pass filters with transfer functions AP1($f$), AP2($f$), AP3($f$), AP4($f$) and AP5($f$) can be obtained by way of a MATLAB tool. Pairs of complementary filters are synthesized to obtain the four all-pass filters, wherein the following equations are satisfied:

$$LP1(f)+HP1(f)=AP1(f) \quad (10);$$

$$LP2(f)+HP2(f)=AP2(f) \quad (11);$$

$$LP3(f)+HP3(f)=AP3(f) \quad (12); \text{ and}$$

$$LP4(f)+HP4(f)=AP4(f) \quad (13).$$

The equalizer according to the present invention then uses such correlated low-pass filters, high-pass filters and all-pass filters to perform desired filtering operations.

For example, the frequency response transfer functions SB1($f$)~SB5($f$) can be exemplified as:

$$SB1(f)=LP1(f)*AP4(f)*AP3(f)*AP2(f)$$

$$SB2(f)=AP4(f)*AP3(f)*LP2(f)*HP1(f)$$

$$SB3(f)=AP4(f)*LP3(f)*HP2(f)HP1(f)$$

$$SB4(f)=LP4(f)*HP3(f)*HP2(f)*HP1(f)$$

$$SB5(f)=HP4(f)*HP3(f)*HP2(f)*HP1(f)$$

Alternatively, the frequency response transfer functions SB1($f$)~SB5($f$) may be set as the following or other suitable combinations satisfying Equation (9):

$$SB1(f)=LP1(f)*LP2(f)*LP3(f)*LP4(f)$$

$$SB2(f)=HP1(f)*LP2(f)*LP3(f)*LP4(f)$$

$$SB3(f)=AP1(f)*HP2(f)*LP3(f)*LP4(f)$$

$$SB4(f)=AP1(f)*AP2(f)*HP3(f)*LP4(f)$$

$$SB5(f)=HP4(f)*AP1(f)*AP2(f)*AP3(f)$$

or $$SB1(f)=LP1(f)*LP2(f)*AP4(f)*AP3(f)$$

$$SB2(f)=AP4(f)*AP3(f)*LP2(f)*HP1(f)$$

$$SB3(f)=AP4(f)*LP3(f)*HP2(f)AP1(f)$$

$$SB4(f)=LP4(f)*HP3(f)*HP2(f)*AP1(f)$$

$$SB5(f)=HP4(f)*HP3(f)*HP2(f)*AP1(f).$$

In these embodiments, AP1($f$), AP2($f$), AP3($f$), AP4($f$) and AP5($f$) may be first-order all-pass filters, LP1($f$), LP2($f$), LP3($f$), LP4($f$) and LP5($f$) may be second-order low-pass filters, and HP1($f$), HP2($f$), HP3($f$), HP4($f$) and HP5($f$) may be second-order high-pass filters.

Figure 5B:
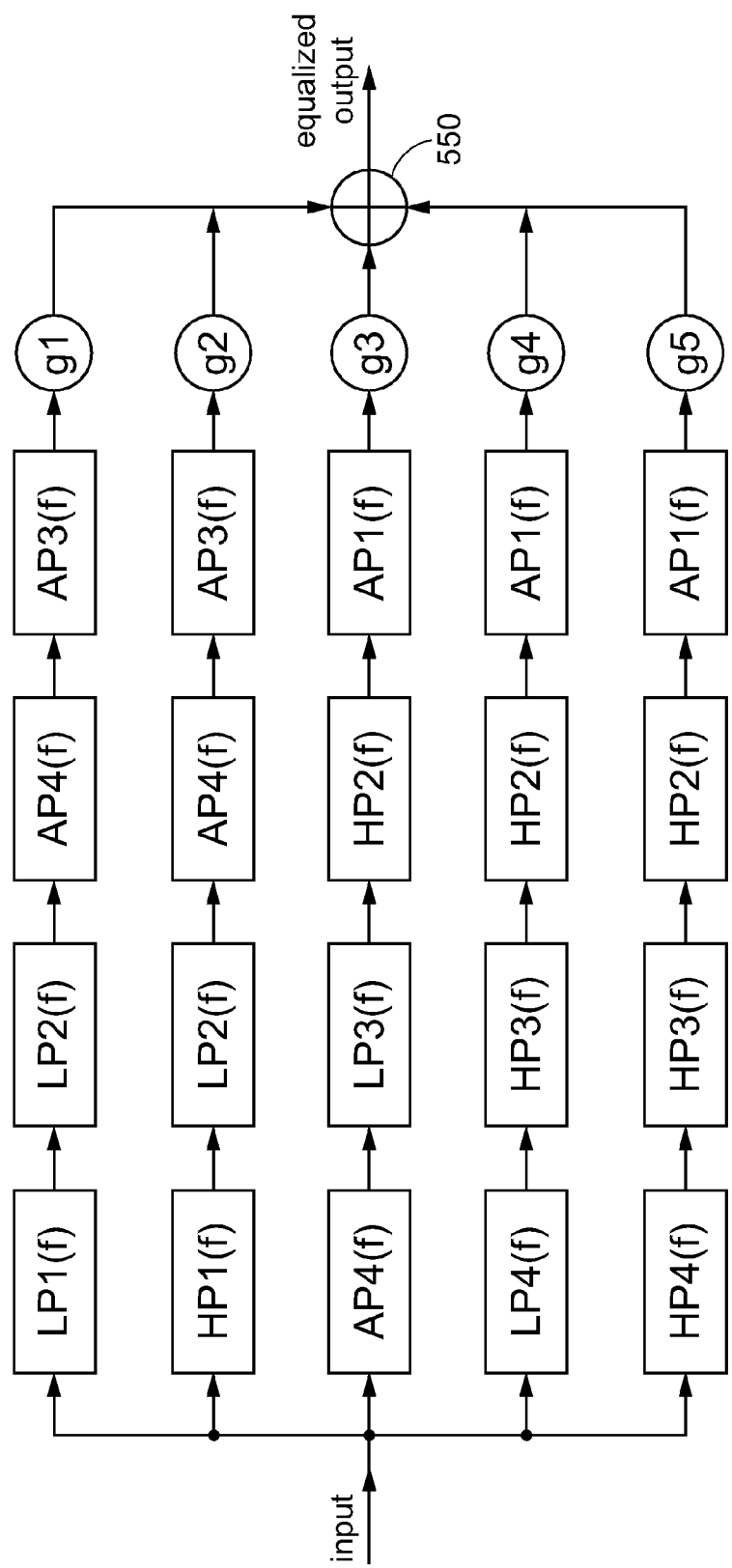
FIG. 5B is a circuit block diagram illustrating an embodiment of the filters for the equalizer in FIG. 5A.

The resulting equalizer is shown in FIG. 5B. The five-band equalizer includes an IIR filtering portion comprising five IIR filters for filtering an input signal simultaneously to produce five filtered outputs, and each of the five IIR filters comprising four (five minus one) filtering units selected from LP1($f$), LP2($f$), AP1($f$), LP2($f$), HP2($f$), AP2($f$), LP3($f$), HP3($f$), AP3($f$), LP4($f$), HP4($f$), and AP4($f$). For example, the five IIR filters are an IIR low-pass filter implemented with LP1($f$)*LP2($f$)*AP4($f$)*AP3($f$), a first IIR band-pass filter implemented with AP4($f$)*AP3($f$)*LP2($f$)*HP1($f$), a second IIR band-pass filter implemented with AP4($f$)*LP3($f$)*HP2($f$)*AP1($f$), a third IIR band-pass filter implemented with LP4($f$)*HP3($f$)*HP2($f$)*AP1($f$) and an IIR high-pass filter implemented with HP4($f$)*HP3($f$)*HP2($f$)*AP1($f$). The five filtered outputs are then gain-adjusted with g1, g2, g3, g4 and g5, respectively, to produce five gain-adjusted Outputs, which are then summed to generate an equalized output signal.

Figure 5C:
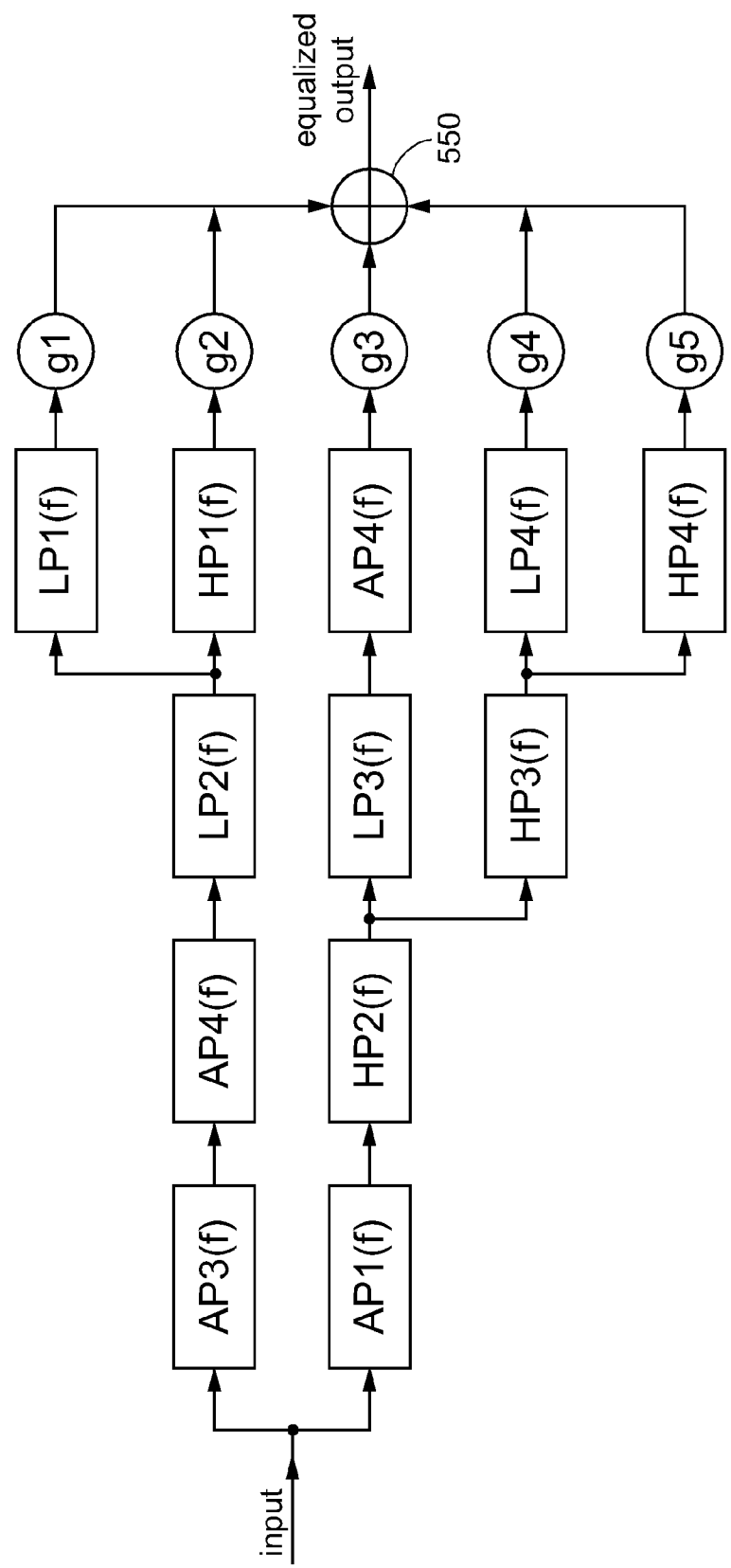
FIG. 5C is a circuit block diagram illustrating a further embodiment of the filters for the equalizer in FIG. 5A, with a tree structure.

By rearranging the filtering units in FIG. 5B, some filtering units may share the same input so that the equalizer 500 may be equivalently presented as a tree structure as shown in FIG. 5C. For example, the filters AP3($f$), AP4($f$) and LP2($f$) are shared by the upper two paths and the filters AP1($f$) and HP2($f$) are shared by the lower three paths. In addition, HP3($f$) is shared by the fourth and fifth paths.

Figure 6A:
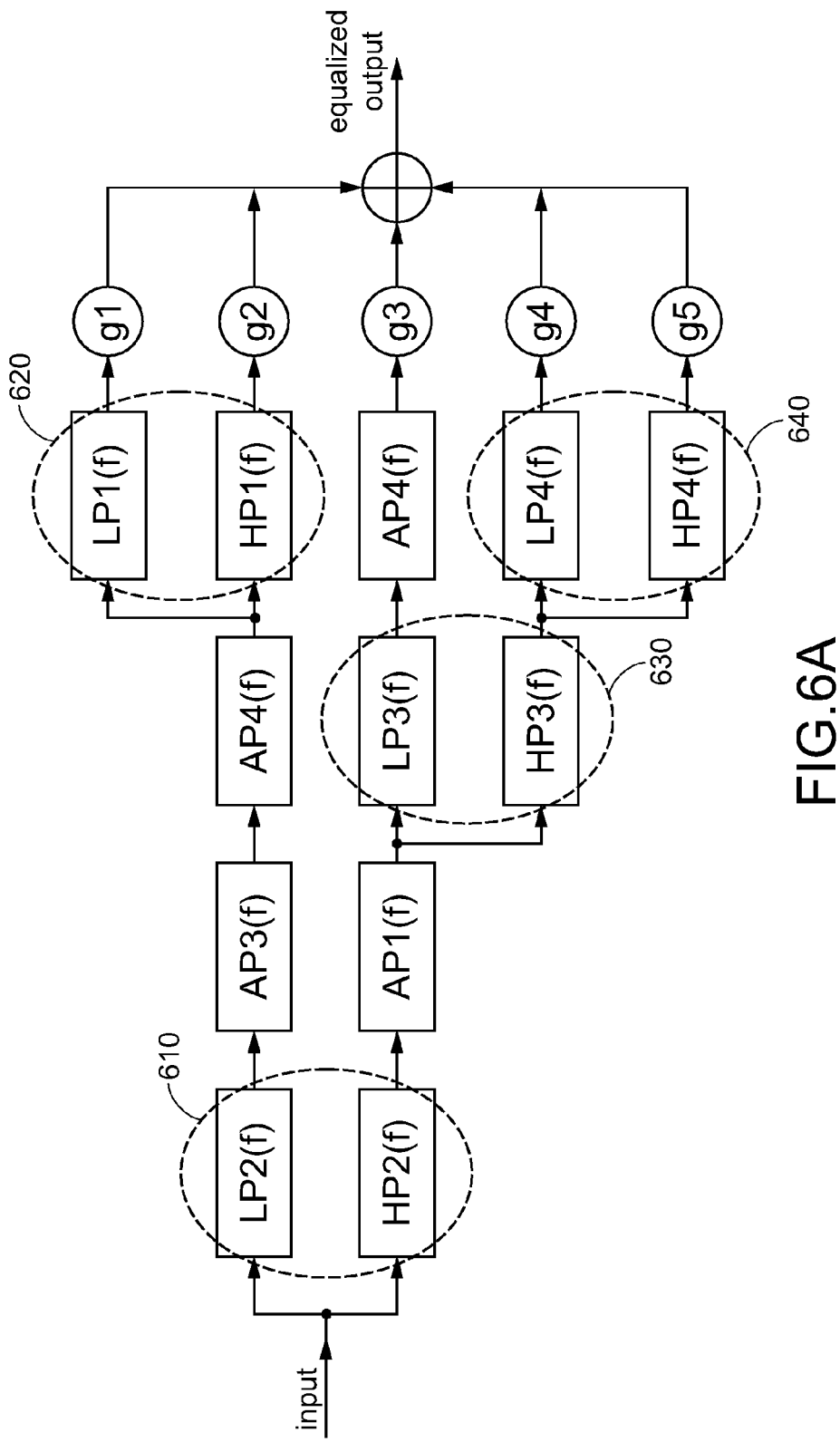
FIG. 6A is a circuit block diagram illustrating further embodiments of the filters included in the equalizer of FIG. 5A, which shows a tree structure.

Alternatively, the IIR filters in FIG. 5C may be further rearranged to result in a tree structure shown in FIG. 6A, wherein four pairs of complementary high-pass and low-pass filters 610, 620, 630 and 640 share the same inputs. Thus the equalizer 500 can be implemented with further simplified circuitry in a manner described hereinafter.

Figure 6B:
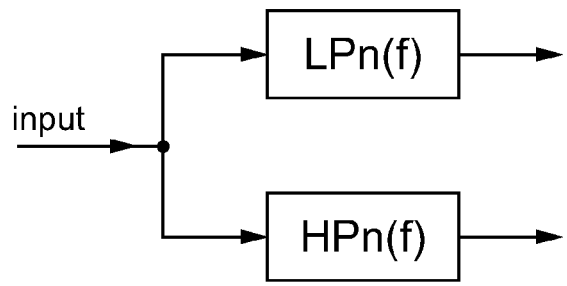
FIG. 6B is a schematic diagram illustrating a pair of complementary high-pass and low-pass filters existent in the tree structure of FIG. 6A.
Figure 6C:
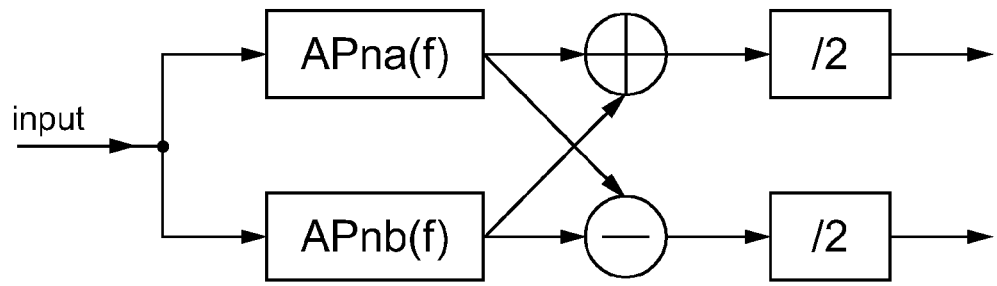
FIG. 6C is a schematic diagram illustrating an alternative form of complementary high-pass and low-pass filters of FIG. 6B.

Please refer to FIG. 6B. When a pair of complementary high-pass and low-pass filters HPn(f) and LPn(f) share a common input, the following equation is satisfied:

$$LP_n(f)+HP_n(f)=AP_n(f) \quad (14)$$

where $1 \leq n \leq N-1$, and N is a band number of the equalizer, and mutually derivable by way of the MATLAB design tool. Furthermore, the low-pass and high-pass filters LPn(f) and HPn(f) can be presented with two lower-order IIR all-pass filters APna(f) and APna(f) generated by MATLAB as shown in FIG. 6C and expressed by the following equations:

$$LPn(f) = (APna(f) + APnb(f))/2 \quad (15); \text{ and}$$

$$HPn(f) = (APna(f) - APnb(f))/2 \quad (16).$$

For example, the low-pass and high-pass filters LPn(f) and HPn(f) are third order, and the all-pass filters APna(f) and APnb(f) are second order. Due to lower-order filters, the hardware can be further simplified. In other words, the four pairs of complementary high-pass and low-pass filters 610, 620, 630 and 640 can be simplified with corresponding lower-order all-pass filters.

Figure 7:
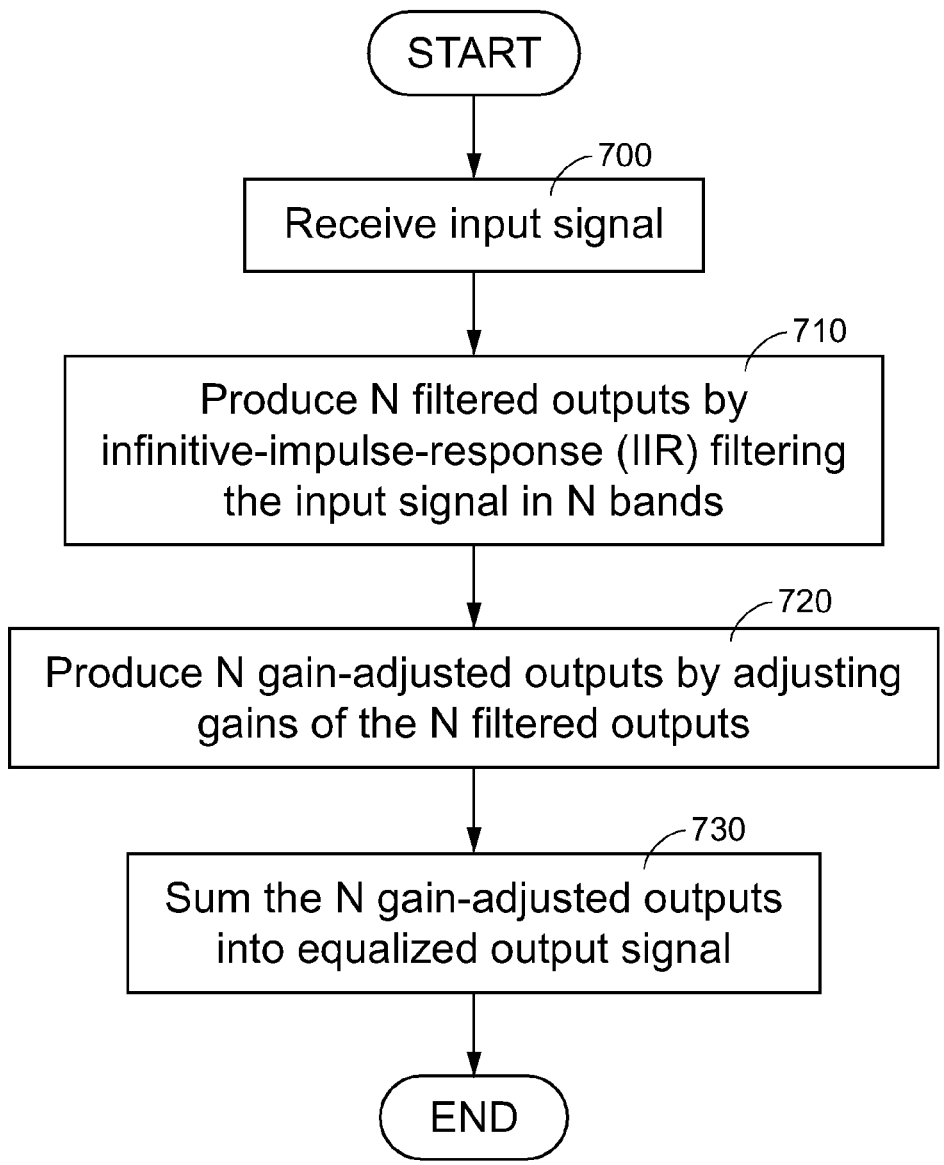
FIG. 7 is a flowchart of an equalizing method according to the present invention.

FIG. 7 illustrates a flowchart of an equalizing method of an N-band equalizer according to an embodiment of the present invention. The flowchart starts from Step 700 when an input signal to be equalized is received. In Step 710, the input signal is subjected to an infinitive impulse response (IIR) filtering process in N bands to produce N filtered outputs, wherein N is an integer larger than 2. The input signal, for example, is an audio signal or a video signal. Then the N filtered outputs are gain-adjusted (Step 720) and summed (Step 730) to obtain an equalized output signal.

In Step 710, (N−1) sets of complementary IIR high-pass and low-pass filtering units and corresponding IIR all-pass filtering units, e.g. $LP_1(f) \sim LP_{N-1}(f)$, $HP_1(f) \sim HP_{N-1}(f)$ and $AP_1(f) \sim AP_{N-1}(f)$, are used for performing the N-band equalizing operation, wherein $LP_n(f) + HP_n(f) = AP_n(f)$, where $1 \le n \le N-1$. Selecting from these filters, N IIR filters with respective frequency response transfer functions $SB_1(f) \sim SB_{N-1}(f)$ are provided, each comprising (N−1) such filtering units. In an example, the low-pass filters $LP_1(f) \sim LP_{N-1}(f)$ and the high-pass filters $HP_1(f) \sim HP_{N-1}(f)$ are second-order filters while the all-pass filters $AP_1(f) \sim AP_{N-1}(f)$ are first-order filters. In order to obtain an ideally flat frequency response, the frequency response transfer functions $SB_1(f) \sim SB_{N-1}(f)$ of the IIR filters fulfill the following equation:

$$\sum_{n=1}^{N} SBn(f) = \prod_{n=1}^{N-1} APn(f)$$

wherein $SB_1(f)$ is a frequency response transfer function of an IIR low-pass filter, $SB_{N-1}(f)$ is a frequency response transfer function of an IIR high-pass filter, and the others are frequency response transfer functions of IIR band-pass filters. For example, $SB_1(f)$ can be set to be $$\prod_{n=1}^{N-1} LPn(f)$$

and $SB_{N-1}(f)$ is set to be $$\prod_{n=1}^{N-1} HPn(f).$$

Alternatively, $SB_1(f)$ can be set to be $$\prod_{n=1}^{N-2} LPn(f) * AP_{N-1}(f)$$

and $SB_{N-1}(f)$ is set to be $$\prod_{n=2}^{N-1} HPn(f) * AP_1(f).$$

The tree structure as shown in FIG. 5C or 6A and reduced filter order as shown in FIG. 6C can be applied to simplify the equalizer hardware complexity.

In Step 720, the N filter outputs are gain-adjusted by respective gains g1~gN so that an ideally flat frequency response can be achieved by relatively simple IIR filters when the gains are substantially equal to one another.

In Step 730, an equalized output signal is obtained as:

$$\text{Equalized output} = \sum_{n=1}^{N} SBn(f) * gn$$

Since the present method utilizes infinitive impulse response filtering to achieve a high quality equalizing, no high-performance microprocessors and/or complicated inverse Fourier transformation are required.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. An equalizer for equalizing an input signal, comprising:
an infinitive impulse response (IIR) filtering portion for filtering the input signal to produce N filtered outputs, wherein the IIR filtering portion includes N IIR filters for simultaneously filtering the input signal to produce the N filtered outputs, respectively, which have respective frequency response transfer functions $SB_1(f) \sim SB_N(f)$ fulfilling the following equation:

$$\sum_{n=1}^{N} SBn(f) = \prod_{n=1}^{N-1} APn(f)$$

where n is an integer no greater than N−1 and no less than 1 and $AP_n(f)$ are frequency response transfer functions of IIR all-pass filters fulfilling the following equation:

$$LP_n(f) + HP_n(f) = AP_n(f)$$

where $LP_n(f)$ are IIR low-pass filters, and $HP_n(f)$ are IIR high-pass filters;
a gain-adjusting portion coupled to the IIR filtering portion for adjusting the N filtered outputs with N gains to produce N gained outputs, respectively; and
an adder for summing the N gained outputs to generate an equalized output signal;

wherein N is an integer larger than 2, and when N gains are all set to a first level, an ideally flat frequency response is obtainable by the equalizer and the equalized output signal is an ideal equalized output signal.

2. The equalizer according to claim 1 wherein:
$SB_1(f)$ is generated using a series combination of at least one LP(f) and at least one AP(f);
$SB_{N-1}(f)$ is generated using a series combination of at least one HP(f) and at least one AP(f); and
for each of 1<n<N−1, $SB_n(f)$ is generated using a series combination of at least one LP(f), at least one HP(f), and at least one AP(f).

3. The equalizer according to claim 2, wherein:
the at least one LP(f) used to generate $SB_1(f)$ includes $LP_1(f)$ and $LP_2(f)$; and
the at least one HP(f) used to generate $SB_{N-1}(f)$ includes $HP_{N-1}(f)$ and $HP_{N-2}(f)$.

4. The equalizer according to claim 1 wherein each of the IIR high-pass filter, IIR low-pass filter and IIR band-pass filter consists of (N−1) cascaded filtering units selected from a group consisting of $LP_n(f)$, $HP_n(f)$ and $AP_n(f)$.

5. The equalizer according to claim 1 wherein the IIR filtering portion includes a plurality of filtering units which are allocated to form a tree structure.

6. The equalizer according to claim 5 wherein the plurality of filtering units include at least one pair of complementary IIR high-pass and low-pass filters sharing the same input, wherein the pair of complementary IIR high-pass filter HPn(f) and IIR low-pass filter LPn(f) are implemented with lower-order IIR all-pass filter converters APna(f) and APnb(f) according to the following equations:

$$LPn(f)=(APna(f)+APnb(f))/2; \text{ and}$$

$$HPn(f)=(APna(f)-APnb(f))/2.$$

7. The equalizer according to claim 5 wherein the tree structure includes N filtering paths for processing the input signal, and each of the N filtering paths include (N−1) cascaded filtering units selected from a group consisting of $LP_n(f)$, $HP_n(f)$ and $AP_n(f)$, where $LP_n(f)$ are IIR low-pass filters, $HP_n(f)$ are IIR high-pass filters, $AP_n(f)$ are IIR all-pass filters, and n is an integer no greater than N−1 and no less than 1.

8. The equalizer according to claim 1 wherein the IIR all-pass filters $AP_n(f)$ have a filter-order lower than that of the IIR low-pass filters $LP_n(f)$ and that of the IIR high-pass filters $HP_n(f)$ according to a MATLAB tool.

9. The equalizer according to claim 1 wherein the N IIR filters include a low-pass filter, which has the frequency response transfer functions $SB_1(f)$ equal to $$\prod_{n=1}^{N-2} LPn(f) * AP_{N-1}(f).$$

10. The equalizer according to claim 1 wherein the N IIR filters include a high-pass filter, which has the frequency response transfer functions $SB_N(f)$ equal to $$\prod_{n=2}^{N-1} HPn(f) * AP_1(f).$$

11. A method applied to an equalizer for equalizing an input signal applied to an N-band equalizer, comprising steps of:
receiving the input signal;
producing N filtered outputs by a plurality of infinitive-impulse-response (IIR) filters filtering the input signal in N bands, wherein the IIR filters includes N IIR filters for simultaneously filtering the input signal to produce the N filtered outputs, respectively, which have respective frequency response transfer functions $SB_1(f)\sim SB_N(f)$ fulfilling the following equation:

$$\sum_{n=2}^{N} SBn(f) = \prod_{n=1}^{N-1} APn(f)$$

where n is an integer no greater than N−1 and no less than 1 and $AP_n(f)$ are frequency response transfer functions of IIR all-pass filters fulfilling the following equation:

$$LP_n(f)+HP_n(f)=AP_n(f)$$

where $LP_n(f)$ are IIR low-pass filters, and $HP_n(f)$ are IIR high-pass filters;
providing N gains respectively to the N filtered outputs to generate N gained outputs; and
adding the N gained outputs into an equalized output signal;
wherein N is an integer larger than 2, and when N gains are all set to a first level, an ideally flat frequency response is obtainable by the equalizer and the equalized output signal is an ideal equalized output signal.

12. The method according to claim 11 wherein:
$SB_1(f)$ is generated using a series combination of at least one LP(f) and at least one AP(f);
$SB_{N-1}(f)$ is generated using a series combination of at least one HP(f) and at least one AP(f); and
for each of 1<n<N−1, $SB_n(f)$ is generated using a series combination of at least one LP(f), at least one HP(f), and at least one AP(f).

13. The method according to claim 12 wherein:
the at least one LP(f) used to generate $SB_1(f)$ includes $LP_1(f)$ and $LP_2(f)$; and
the at least one HP(f) used to generate $SB_{N-1}(f)$ includes $HP_{N-1}(f)$ and $HP_{N-2}(f)$.

14. The method according to claim 11 wherein the IIR all-pass filter transfer functions $AP_n(f)$ is of a first-order
3
and $LP_n(f)$ are second-order IIR low-pass filter transfer functions, and $HP_n(f)$ are second-order IIR high-pass filter transfer functions.

15. The method according to claim 14 wherein the filter transfer functions $LP_n(f)$, $HP_n(f)$ and $AP_n(f)$ are generated by way of a MATLAB tool.

16. The method according to claim 11 wherein the IIR filtering step is performed along N parallel filtering paths to produce the N filtered outputs, respectively, each of the N parallel filtering paths uses cascaded (N−1) filter transfer functions, and adjacent two of the N parallel filtering paths share a common filter transfer function.

17. The method according to claim 16 wherein the N parallel filtering paths form a tree structure of filter transfer functions.

* * * * *